(12) United States Patent
Cheng et al.

(10) Patent No.: US 7,569,434 B2
(45) Date of Patent: Aug. 4, 2009

(54) PFETS AND METHODS OF MANUFACTURING THE SAME

(75) Inventors: Kangguo Cheng, Beacon, NY (US); Louis Lu-Chen Hsu, Fishkill, NY (US); Jack Allan Mandelman, Flat Rock, NC (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 11/335,763

(22) Filed: Jan. 19, 2006

(65) Prior Publication Data

US 2007/0166890 A1 Jul. 19, 2007

(51) Int. Cl.
*H01L 21/00* (2006.01)
(52) U.S. Cl. .................. 438/149; 438/197; 438/300; 257/E21.409; 257/E29.345
(58) Field of Classification Search ............... 438/149, 438/163; 257/347
See application file for complete search history.

(56) References Cited

U.S. PATENT DOCUMENTS

| | | | |
|---|---|---|---|
| 6,828,630 B2 * | 12/2004 | Park et al. ............... | 257/339 |
| 6,982,208 B2 * | 1/2006 | Lee et al. ................ | 438/455 |
| 7,029,964 B2 * | 4/2006 | Cheng et al. ............. | 438/197 |
| 7,238,561 B2 * | 7/2007 | Zhang et al. ............. | 438/197 |
| 7,306,997 B2 * | 12/2007 | Xiang et al. ............. | 438/300 |
| 2002/0086463 A1 * | 7/2002 | Houston et al. .......... | 438/148 |
| 2002/0171107 A1 * | 11/2002 | Cheng et al. ............ | 257/347 |
| 2004/0045499 A1 * | 3/2004 | Langdo et al. ........... | 117/84 |
| 2006/0148143 A1 * | 7/2006 | Bedell et al. ............ | 438/162 |
| 2006/0186487 A1 * | 8/2006 | Lee ........................ | 257/411 |
| 2006/0226492 A1 * | 10/2006 | Nguyen et al. .......... | 257/369 |
| 2007/0001227 A1 * | 1/2007 | Barbe et al. ............. | 257/347 |
| 2007/0069300 A1 * | 3/2007 | Cheng et al. ............ | 257/368 |

* cited by examiner

*Primary Examiner*—W. David Coleman
*Assistant Examiner*—Shaka Scarlett
(74) *Attorney, Agent, or Firm*—Dugan & Dugan, PC

(57) ABSTRACT

In a first aspect, a first method of manufacturing a PFET on a substrate is provided. The first method includes the steps of (1) forming a gate channel region of the PFET having a first thickness on the substrate; and (2) forming at least one composite source/drain diffusion region of the PFET having a second thickness greater than the first thickness on the substrate. The at least one composite source/drain diffusion region is adapted to cause a strain in the gate channel region. Further, significantly all of the at least one composite source/drain diffusion region is below a bottom surface of a gate of the PFET. Numerous other aspects are provided.

17 Claims, 17 Drawing Sheets

PFETS AND METHODS OF MANUFACTURING THE SAME

FIELD OF THE INVENTION

The present invention relates generally to semiconductor device manufacturing, and more particularly to PFETs and methods of manufacturing the same.

BACKGROUND OF THE INVENTION

A conventional p-channel MOSFET (PFET) may include composite semiconductor source/drain regions with an embedded silicon germanium (SiGe) region on a silicon-on-insulator (SOI) layer. The SiGe region may cause a stress in the SOI layer that improves PFET performance. However, in the conventional PFET, such composite semiconductor source/drain regions have the same thickness as a gate channel region therebetween. Since thinner gate channel region SOI is sought in order to enable improved device characteristics, the thickness of the composite source/drain regions may be constrained to small values. However, manufacturing control issues limit a minimum thickness of the SOI layer in the source/drain regions. Therefore, the thickness of the embedded SiGe region of the conventional PFET is reduced. Consequently, a strain caused by such a SiGe region in the gate channel region of the SOI layer is reduced, which adversely affects performance of such conventional PFET. Accordingly, improved PFETs and methods of manufacturing the same are desired.

SUMMARY OF THE INVENTION

In a first aspect of the invention, a first method of manufacturing a PFET on a substrate is provided. The first method includes the steps of (1) forming a gate channel region of the PFET having a first thickness on the substrate; and (2) forming at least one composite source/drain diffusion region of the PFET having a second thickness greater than the first thickness on the substrate. The at least one composite source/drain diffusion region is adapted to cause a strain in the gate channel region. Further, significantly all of the at least one composite source/drain diffusion region is below a bottom surface of a gate of the PFET.

In a second aspect of the invention, a first apparatus is provided. The first apparatus is PFET formed on a substrate. The PFET includes (1) a gate channel region having a first thickness formed on the substrate; and (2) at least one composite source/drain diffusion region having a second thickness greater than the first thickness formed on the substrate. The at least one composite source/drain diffusion region is adapted to cause a strain in the gate channel region. Further, significantly all of the at least one composite source/drain diffusion region is below a bottom surface of a gate of the PFET.

In a third aspect of the invention, a first system is provided. The first system is a substrate that includes a PFET comprising (1) a gate channel region having a first thickness formed on the substrate; and (2) at least one composite source/drain diffusion region having a second thickness greater than the first thickness formed on the substrate. The at least one composite source/drain diffusion region is adapted to cause a strain in the gate channel region. Further, significantly all of the at least one composite source/drain diffusion region is below a bottom surface of a gate of the PFET. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides PFETs and methods of manufacturing the same. Specifically, the present invention provides a PFET having at least one composite semiconductor source/drain diffusion region which is thicker than a gate channel region of the PFET. For example, a composite source/drain diffusion region may be adapted to cause a stress and/or strain in the gate channel region that improves PFET performance. Significantly all of the composite source/drain diffusion region may be below a bottom surface of a gate of the PFET. Each composite semiconductor source/drain diffusion region may include an embedded SiGe region above a portion of an SOI layer. The embedded SiGe region may be thicker than that of a conventional PFET employing embedded SiGe. Consequently, a stress and/or strain caused in the gate channel region by such embedded SiGe regions is increased, thereby improving PFET performance. In this manner, the present invention provides and includes improved PFETs and methods of manufacturing the same.

Figure 1:
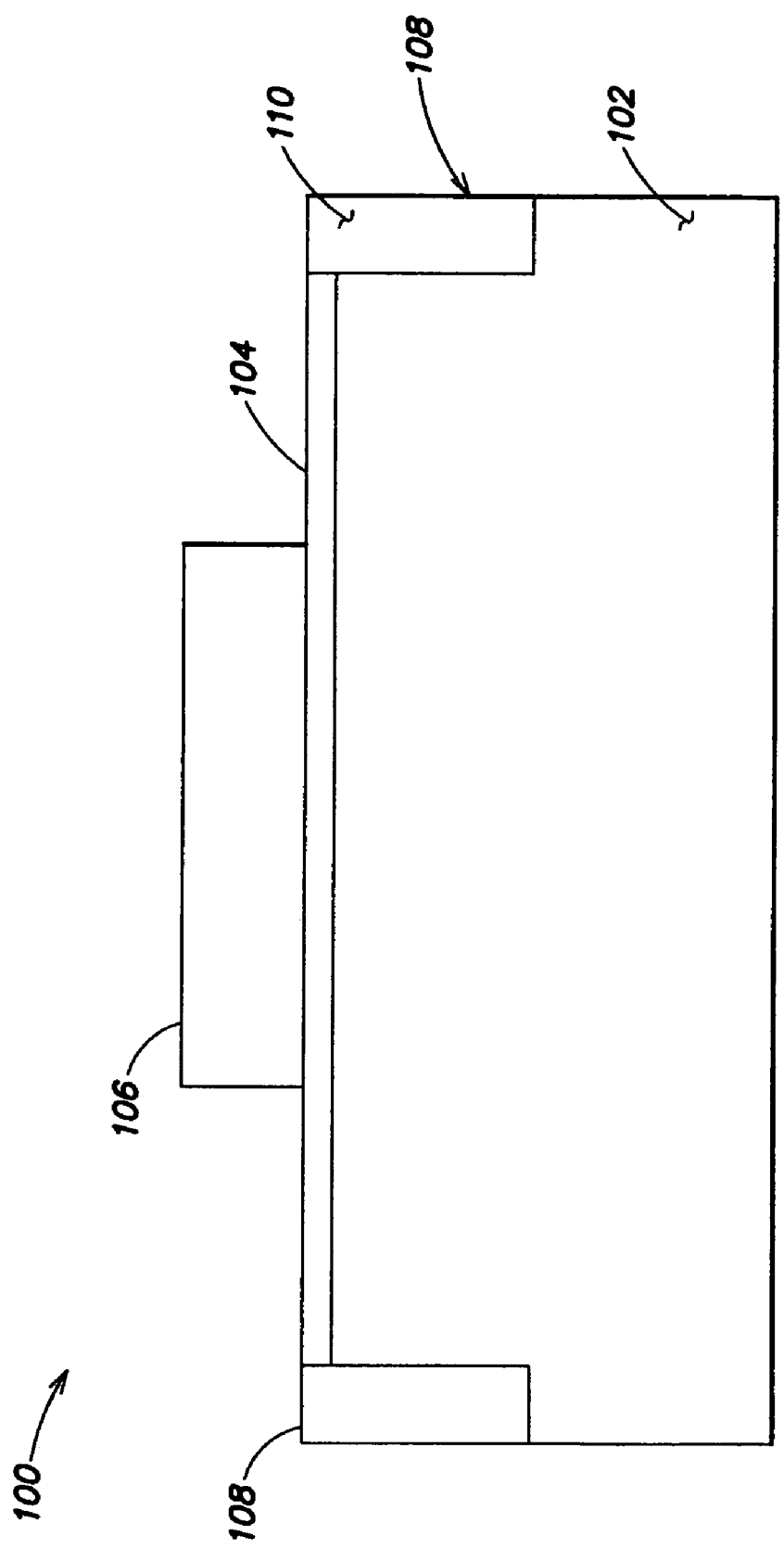
FIG. 1 illustrates a cross-sectional side view of a substrate 101 following a step of a first exemplary method of forming an improved PFET in which a pad oxide layer, a pad nitride layer and STI trench regions are formed in accordance with an embodiment of the present invention.

FIG. 1 illustrates a cross-sectional side view of a substrate 100 following a step of a first exemplary method of forming an improved PFET in which a pad oxide layer, a pad nitride layer and STI trench regions are formed in accordance with an embodiment of the present invention. With reference to FIG. 1, bulk silicon 102 may be provided. A pad oxide layer 104 (e.g., silicon dioxide or the like) may be formed on a top surface of the bulk silicon 102 by a chemical vapor deposition (CVD), thermal oxidation or another suitable process. The pad oxide layer 104 may be about 2 nm to about 20 nm thick, although a different thickness range may be employed. A pad nitride layer 106 (e.g., silicon nitride or the like) with a thickness of about 50 nm to about 200 nm may be formed by CVD or another suitable process above the pad oxide layer 104, although a different thickness range may be employed.

The pad nitride layer 106 may be patterned for the formation of shallow isolation trenches 108 using lithography, resist strip and/or any other suitable processes. The bulk silicon 102, the pad oxide layer 104 and the pad nitride layer 106 may be exposed to a reactive ion etching (RIE) or another suitable process so as to form the shallow isolation trenches 108.

The trenches 108 may be filled with oxide 110 (e.g., silicon dioxide or the like) using CVD (e.g., high density plasma (HDP), tetraethylorthosilicate (TEOS) and/or the like). Chemical mechanical polishing (CMP) may be employed to remove portions of the oxide 110. The pad nitride layer 106 may serve as an etch mask during RIE of the shallow isolation trenches. The pad nitride layer 106 may patterned by conventional lithography and RIE and/or any other suitable processes. The resulting nitride layer 106 pattern may be employed as mock gates during subsequent processing.

Figure 2:
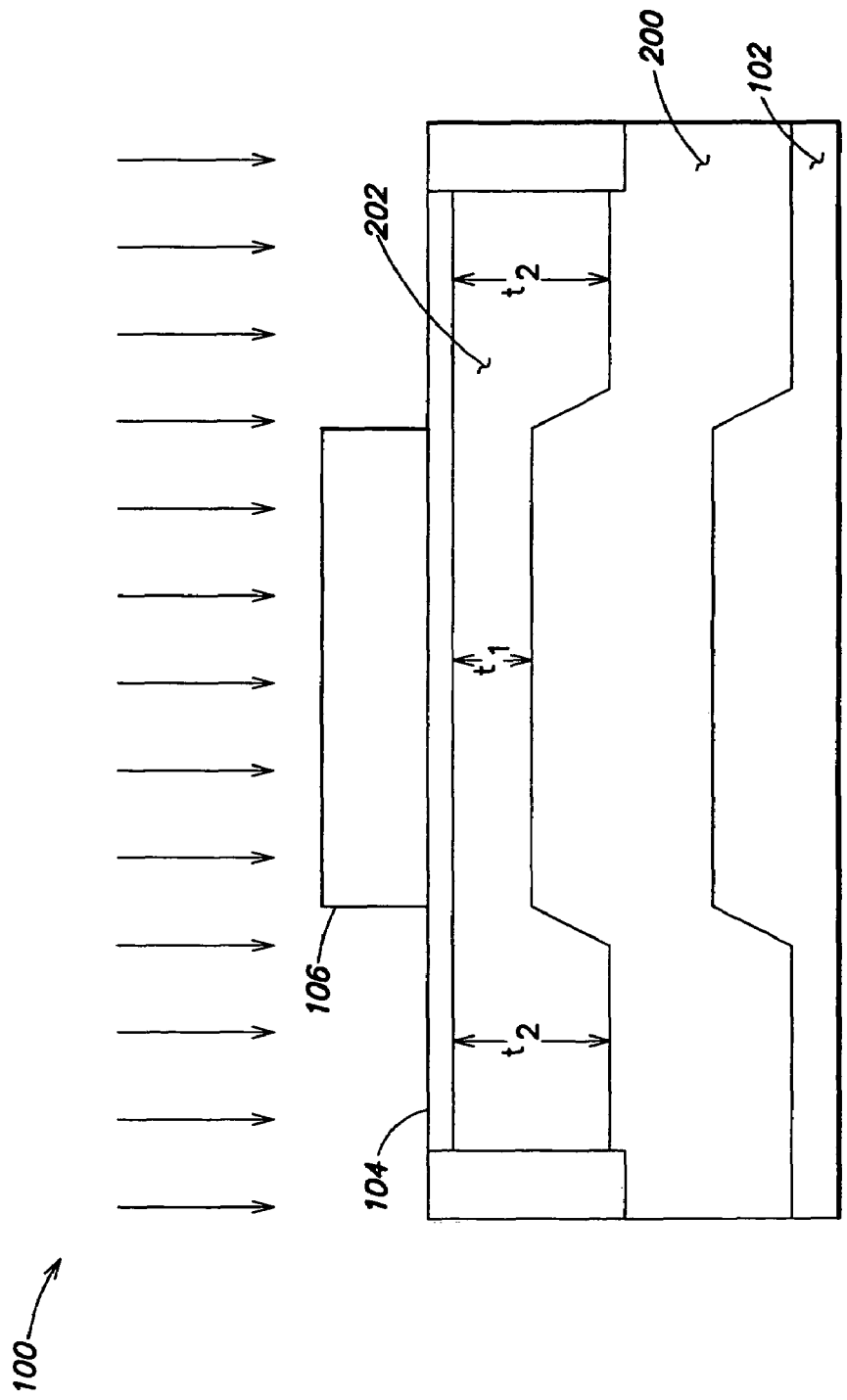
FIG. 2 illustrates a cross-sectional side view of the substrate following a step of the first exemplary method of forming an improved PFET in which oxygen is implanted into the substrate 100 in accordance with an embodiment of the present invention.

FIG. 2 illustrates a cross-sectional side view of the substrate 100 following a step of the first exemplary method of forming an improved PFET in which oxygen is implanted into the substrate 100 in accordance with an embodiment of the present invention. With reference to FIG. 2, the substrate 100 may be exposed to an oxygen implantation process or another suitable process so as to form an oxygen-implanted layer 200 in the bulk substrate 102. Consequently, a silicon layer 202 may be formed between the oxygen-implanted layer 200 and the pad oxide layer 104. The oxygen implantation process may employ an energy range of about 30 keV to about 250 keV to implant a dose of ionized atomic oxygen ($O^+$) of about $5\times10^{17}$ cm$^{-2}$ to about $5\times10^{18}$ cm$^{-2}$ into the substrate 100 (although larger or smaller and/or different energy range and/or dosage range may be employed). Additionally or alternatively, a different type of oxygen, such as molecular oxygen may be implanted into the substrate 100.

The pad nitride layer 106 may affect a depth at which the oxygen is implanted into the substrate 100 thereunder. For example, oxygen which passes through the pad nitride layer 106 may be implanted into the substrate 100 shallower than remaining oxygen. Consequently, the silicon layer 202 may be thinner in the region disposed under the pad nitride layer 106 than other regions. For example, the region of the silicon layer 202 disposed beneath the nitride layer 106 may have a thickness t1 of about 10 nm to about 50 nm. The region of the silicon layer 202 not disposed under the nitride layer 106 may have a thickness t2 of about 50 nm to about 300 nm. However, a larger or smaller and/or different thickness range may be employed for the silicon layer 202 beneath the nitride layer 106 and/or for the silicon layer 202 elsewhere (e.g., not beneath the nitride layer 106).

Figure 3:
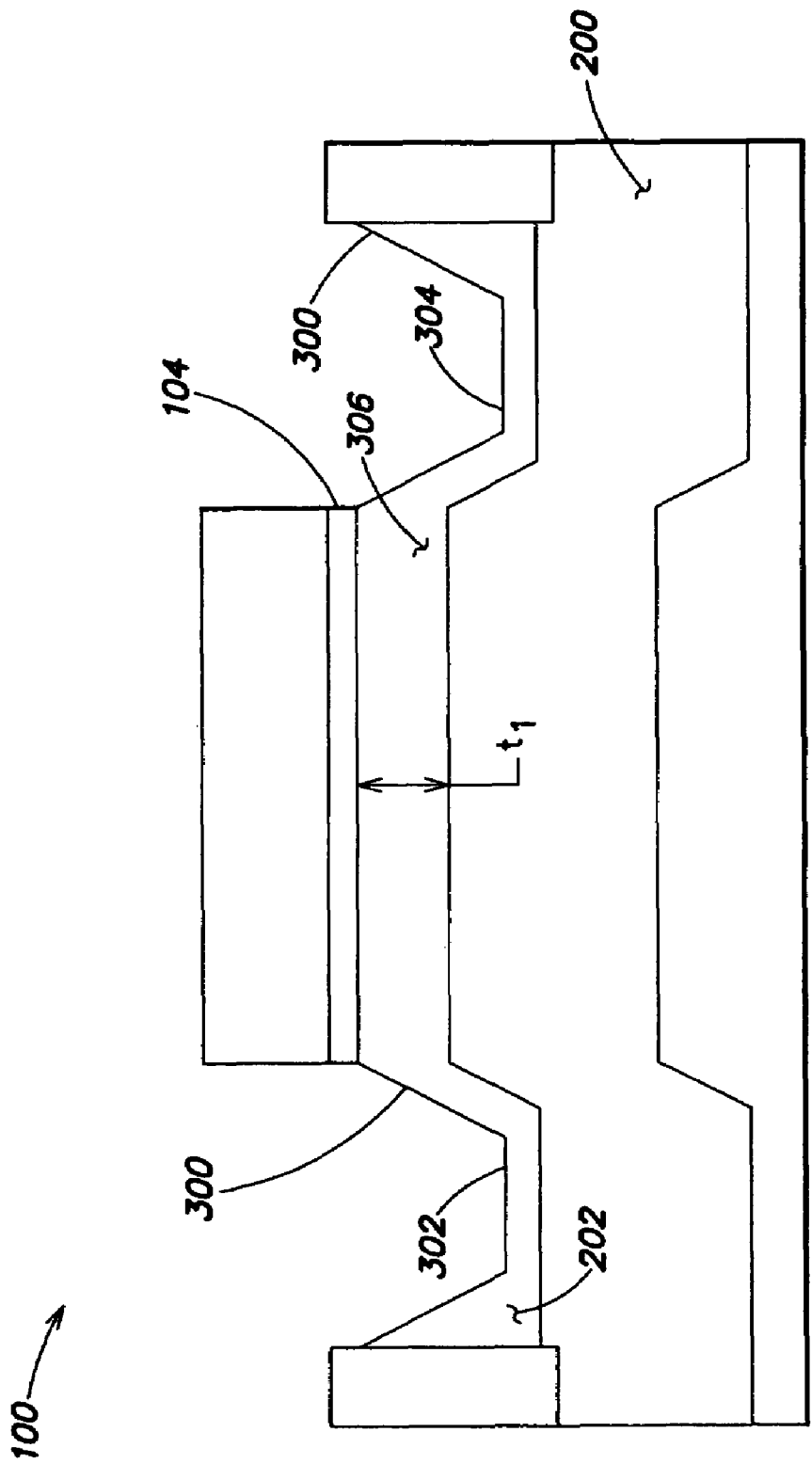
FIG. 3 illustrates a cross-sectional side view of the substrate following a step of the first exemplary method of forming an improved PFET in which exposed portions of the pad oxide layer are removed and portions of the silicon layer are recessed in accordance with an embodiment of the present invention.

FIG. 3 illustrates a cross-sectional side view of the substrate 100 following a step of the first exemplary method of forming an improved PFET in which exposed portions of the pad oxide layer are removed and portions of the silicon layer are recessed in accordance with an embodiment of the present invention. With reference to FIG. 3, selective reactive ion etching (RIE) or another suitable method may be employed to remove the exposed portions of the pad oxide layer 104. Further, one or more portions of the silicon layers 202 may be removed (e.g., using tapered RIE or the like) so as to form recesses 300. In this manner, the recesses 300 may be formed such that sidewalls of the recesses 300 may have slopes so as to provide a tapered profile to the recesses 300. The taper RIE may allow a controlled thickness of the silicon layer 202 to remain. For example, the thickness of the silicon layer 202 remaining above the oxygen-implanted layer 200 may range from about 20 nm to about 60 nm. Portions of the silicon layer 202 in respective bottoms 302, 304 of the recesses 300 may serve as a seed layer for subsequent epitaxial processes and/or the like. In this manner, regions of SiGe or another suitable material may be grown in the recesses 300. Such regions may serve as source/drain regions of the PFET being manufactured. Portions of the silicon (e.g., silicon-on-insulator (SOI)) layer 202 beneath the nitride layer 106 may serve as a channel 306 of the PFET being manufactured. The channel 306 may have a thickness t1 of about 10 nm to about 50 nm (although larger or smaller and/or different thickness range may be employed).

Figure 4:
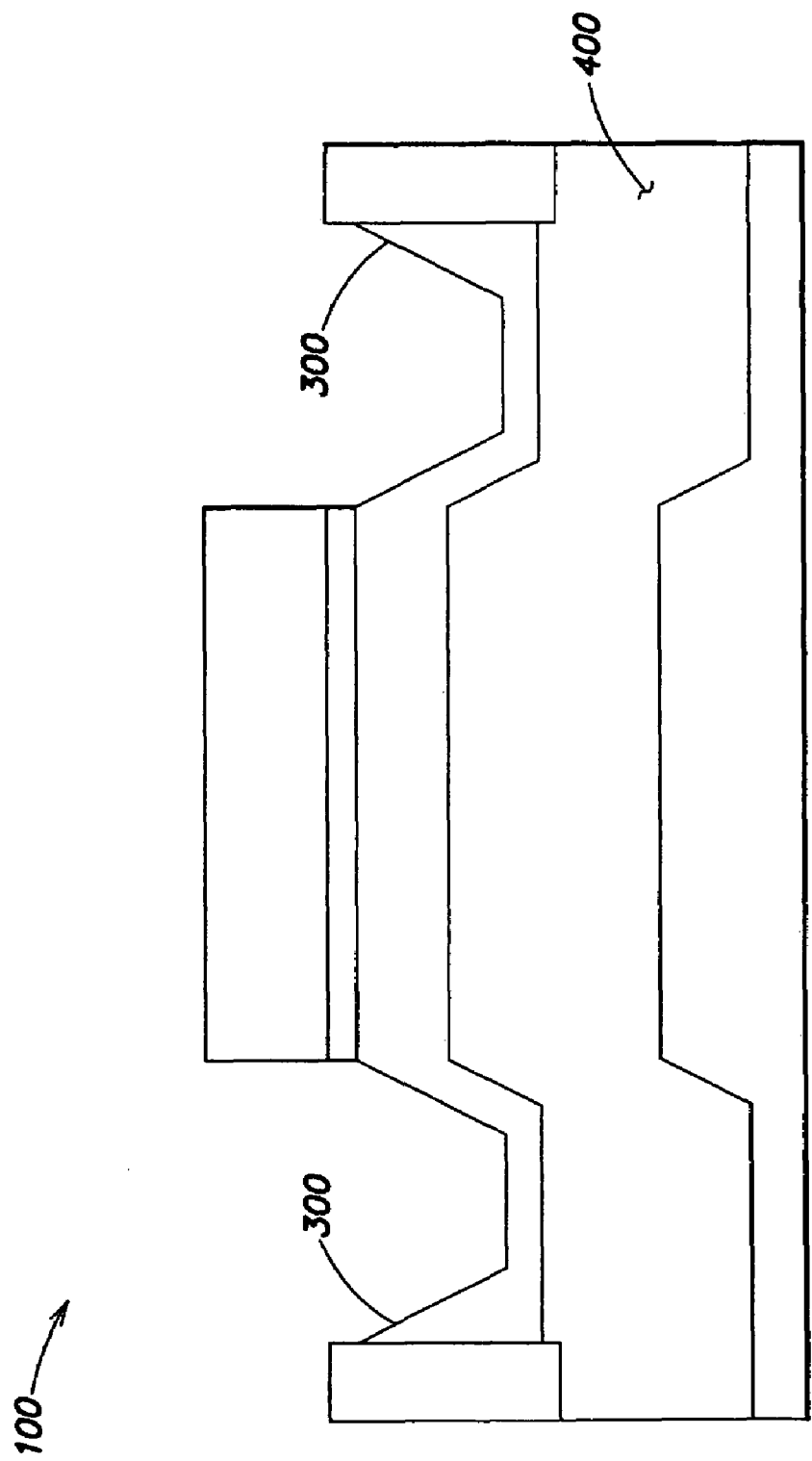
FIG. 4 illustrates a cross-sectional side view of the substrate following a step of the first exemplary method of forming an improved PFET in which an oxygen-implanted layer is chemically converted into an oxide layer in accordance with an embodiment of the present invention.

FIG. 4 illustrates a cross-sectional side view of the substrate 100 following a step of the first exemplary method of forming an improved PFET in which the oxygen-implanted layer is chemically converted into an oxide layer in accordance with an embodiment of the present invention. With reference to FIG. 4, the substrate 100 may undergo annealing (e.g., similar to a standard "separation by implantation oxygen" (SIMOX) method used to form SOI and/or the like). Annealing may be performed at about 1000 degrees Celsius (°C.) to about 1300° C. for about 1 hour to about 10 hours. However, annealing may be performed using a larger or smaller and/or different temperature range. Additionally or alternatively, annealing may be performed for a longer or shorter and/or different time period. Consequently, the oxygen implanted in the oxygen-implanted layer 200 may chemically react (e.g., combine) with the silicon so as to form a buried oxide (BOX) layer 400 (e.g., a silicon oxide (SiO) layer and/or the like). In this manner, the oxygen-implanted region or layer 200 may be converted to the BOX layer 400. In some embodiments, the substrate 100 may be exposed to a process (e.g., short isotropic etch and or the like) adapted to remove undesired material from portions of a top surface of the substrate 100. For example, the clean process may remove oxide material (e.g., silicon dioxide and/or the like) from the surfaces of the recesses 300 with a fluorine (e.g., HF) containing etch.

Figure 5:
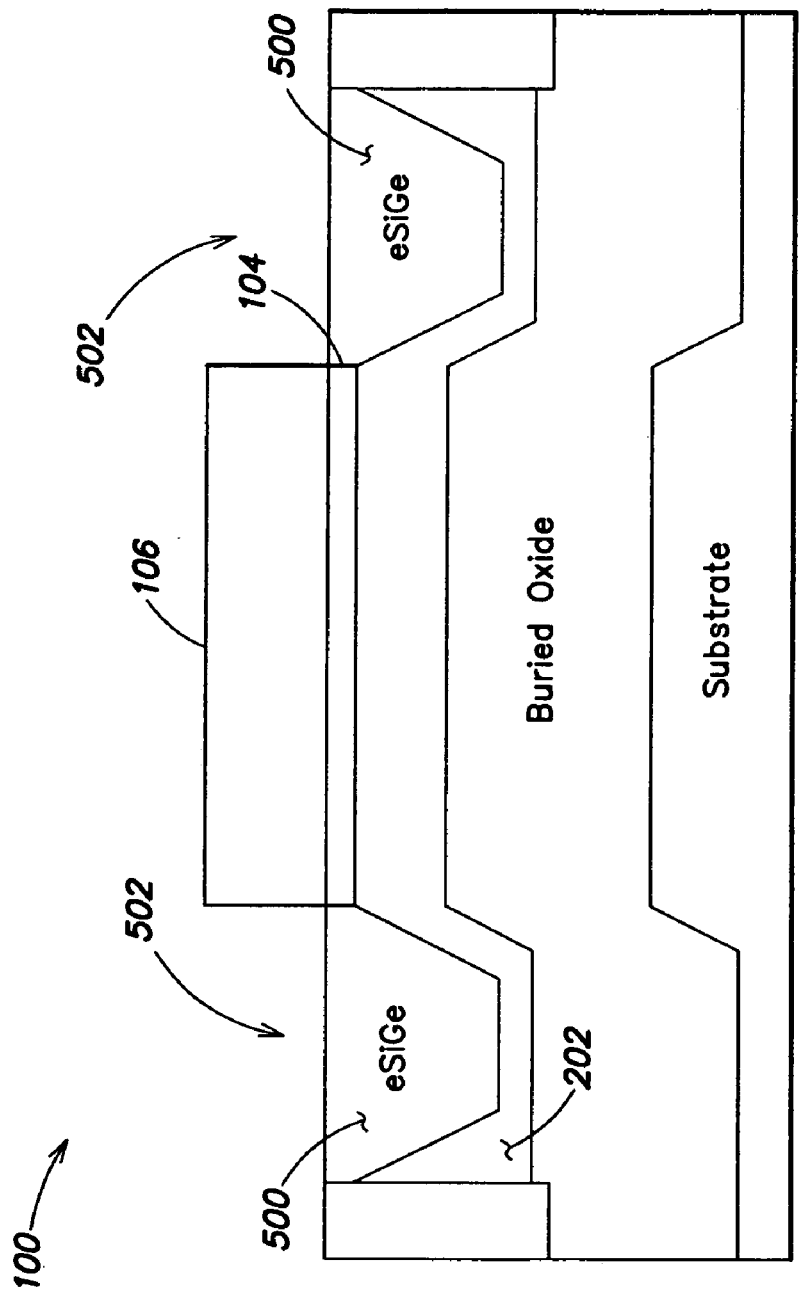
FIG. 5 illustrates a cross-sectional side view of the substrate following a step of the first exemplary method of forming an improved PFET in which silicon germanium (SiGe) regions are formed in the source/drain regions of the PFET in accordance with an embodiment of the present invention.

FIG. 5 illustrates a cross-sectional side view of the substrate 100 following a step of the first exemplary method of forming an improved PFET in which SiGe regions are formed in the source/drain regions of the PFET in accordance with an embodiment of the present invention. With reference to FIG. 5, epitaxy or another suitable method may be employed to form SiGe regions 500 in the recesses 300. During epitaxy a lattice structure (e.g., inter atomic spacing, geometrical arrangements and/or the like) of SiGe on a top surface of the silicon layer 202 may attempt to match a lattice structure of silicon in the silicon layer 202. Such matching of a lattice structure at a bottom surface of the SiGe regions 500 and the top surface of the silicon layer 202 may induce lattice strain (e.g., elastic atomic displacement and/or the like) in portions of the SiGe regions 500 and/or silicon layer 202 thereunder. During epitaxy the SiGe regions 500 may be grown by adding silicon and/or germanium atoms to the existing lattice structure of the SiGe regions 500. Epitaxy may continue until a top surface of the SiGe region 500 is higher than the pad nitride layer 106, thereby achieving overgrowth.

Thereafter, chemical mechanical polishing (CMP) or another suitable method may be employed to planarize the top surface of each SiGe region 500 with the top surface of the pad nitride layer 106. A selective recess process (e.g., RIE and/or the like) may remove portions of the SiGe regions 500 such that respective top surfaces of the SiGe regions 500 are approximately planar with a top surface of the pad oxide layer 104. Each SiGe region 500 along with a portion of the silicon layer 202 thereunder may form one or more portions of a composite semiconductor source/drain region 502 of the PFET.

Figure 6:
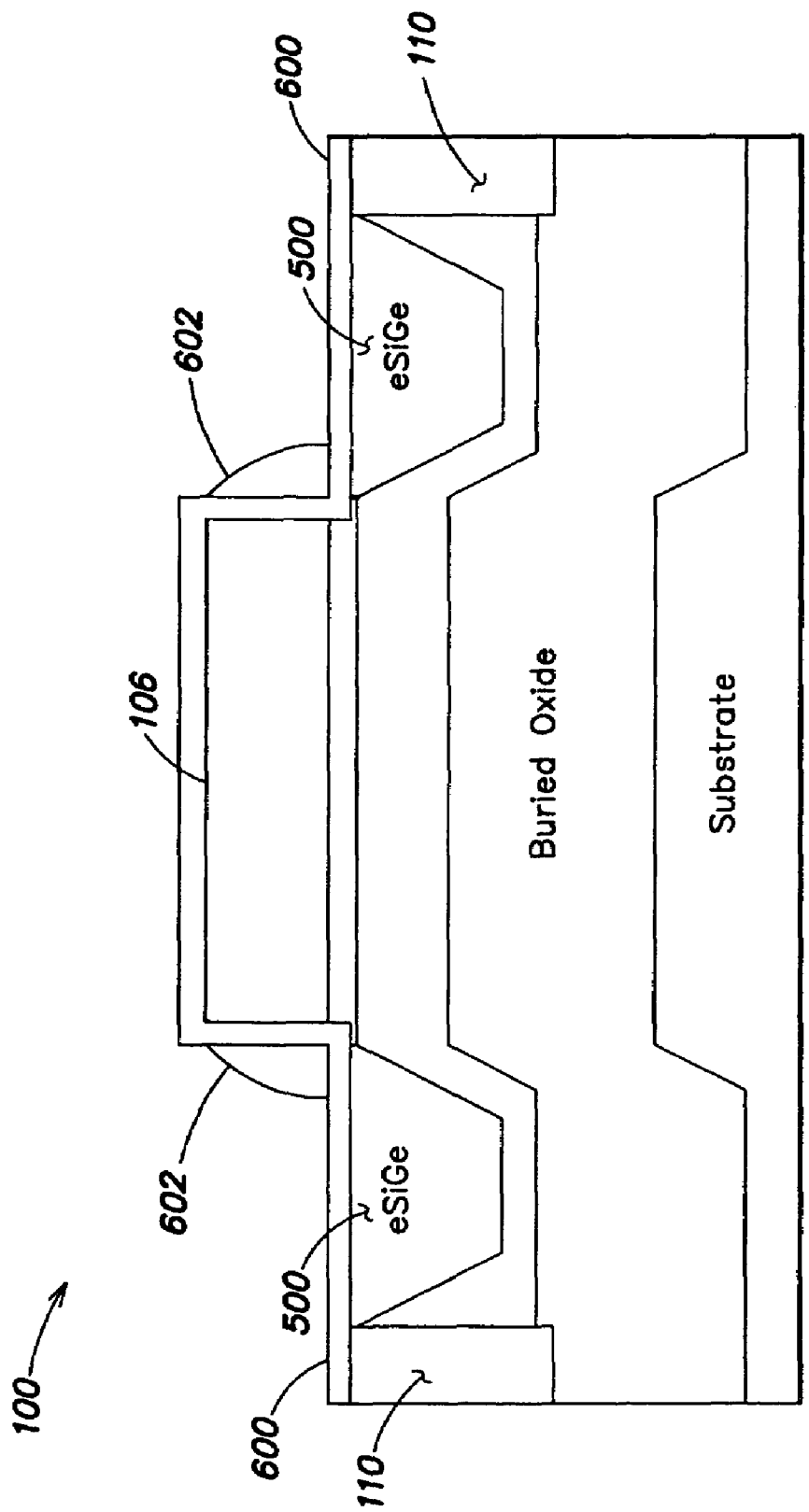
FIG. 6 illustrates a cross-sectional side view of the substrate following a step of the first exemplary method of forming an improved PFET in which an oxide liner and a nitride spacer are formed in the source/drain regions of the PFET in accordance with an embodiment of the present invention.

FIG. 6 illustrates a cross-sectional side view of the substrate 100 following a step of the first exemplary method of forming an improved PFET in which an oxide liner and a nitride spacer are formed in the source/drain regions of the PFET in accordance with an embodiment of the present invention. With reference to FIG. 6, CVD or another suitable method may be employed to form an oxide liner 600 on the SiGe regions 500, oxide 110 and at least one surface (e.g., a sidewall) of the pad nitride layer 106. Further, CVD or another suitable method followed by RIE or another suitable method may be employed to form nitride spacers 602 on at least a surface (e.g., a sidewall) of the oxide liner 600.

Figure 7:
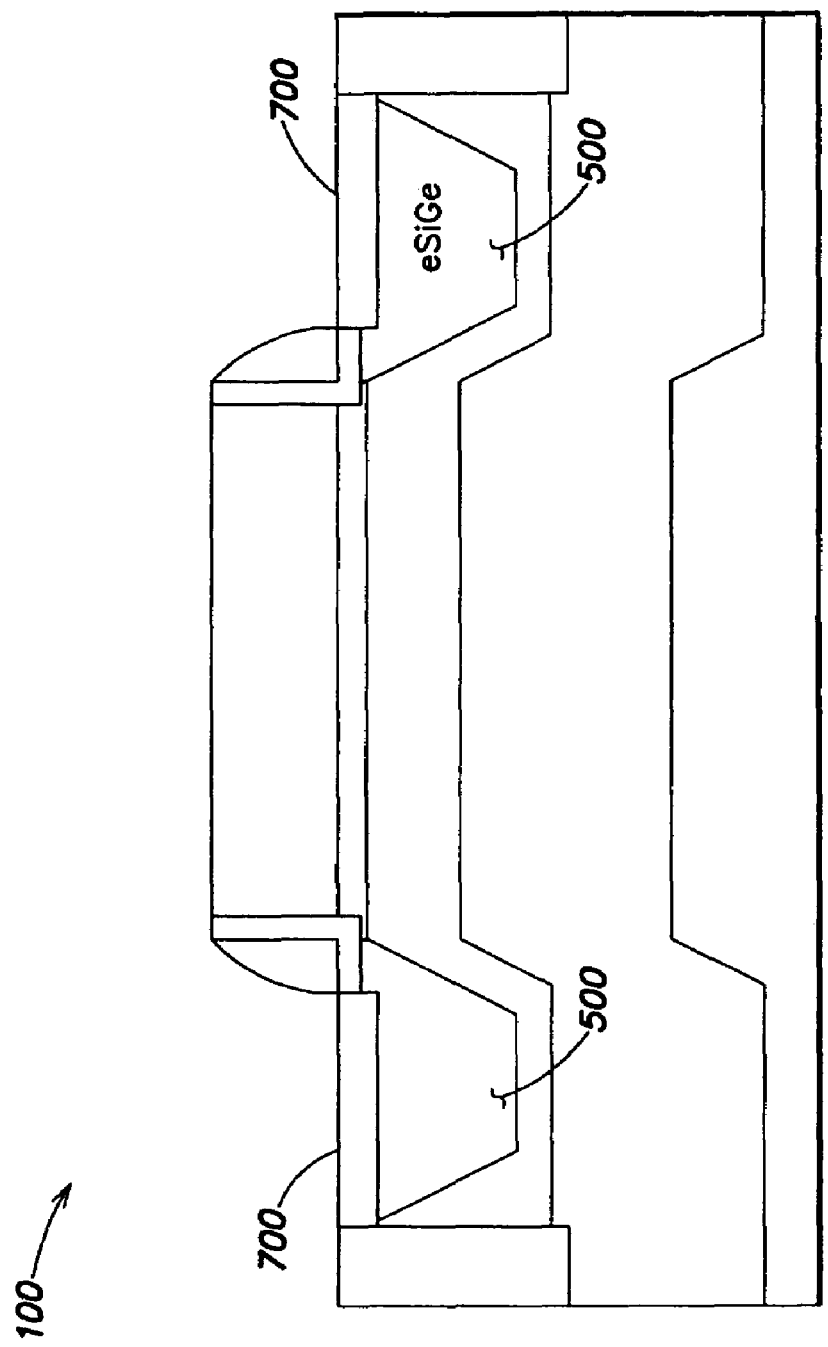
FIG. 7 illustrates a cross-sectional side view of the substrate following a step of the first exemplary method of forming an improved PFET in which portions of the oxide liner may be removed and portions of the SiGe region may be silicided in accordance with an embodiment of the present invention.

FIG. 7 illustrates a cross-sectional side view of the substrate 100 following a step of the first exemplary method of forming an improved PFET in which portions of the oxide liner may be removed and portions of the SiGe regions may be silicided in accordance with an embodiment of the present invention. With reference to FIG. 7, isotropic or anisotropic etching (e.g., for a short time period) and/or the like may be employed to remove portions of the oxide liner 600 above the SiGe regions 500 and on a top surface of pad nitride 106. Consequently, portions of a top surface of the SiGe regions 500 may be exposed. Deposition of a thin layer of metal such as titanium, tantalum, cobalt, tungsten, nickel or the like followed by an anneal to react the metal with the exposed SiGe regions 500 is used to form a silicide layer. The anneal is followed by a metal etch to remove unreacted metal from the surfaces of pad nitride 106, nitride spacers 602, STI oxide 110, and oxide liner 600. This leaves silicide regions 700 remaining on exposed portions of the SiGe regions 500. The silicide regions 700 may comprise an alloy of SiGe and/or other materials (e.g., titanium, tantalum, cobalt, tungsten, nickel and/or the like) so as to be conductive. The silicide regions 700 may be employed as contact points for studs in an embodiment of a PFET.

Figure 8:
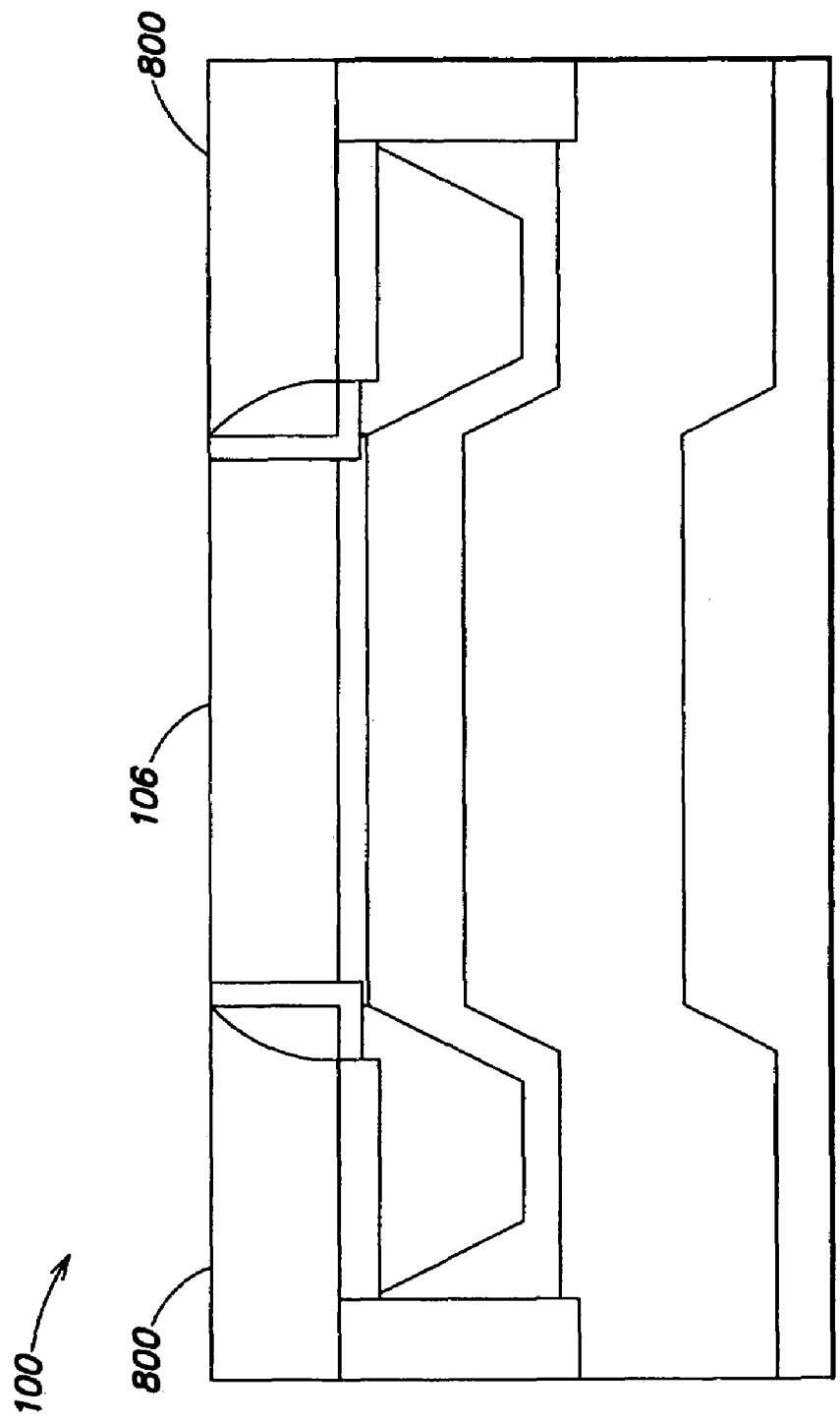
FIG. 8 illustrates a cross-sectional side view of the substrate following a step of the first exemplary method of forming an improved PFET in which HDP oxide regions may be formed in accordance with an embodiment of the present invention.

FIG. 8 illustrates a cross-sectional side view of the substrate 100 following a step of the first exemplary method of forming an improved PFET in which HDP oxide regions may be formed in accordance with an embodiment of the present invention. With reference to FIG. 8, high density plasma deposition (HDP) or another suitable method may be employed to form an HDP oxide (e.g., SiO region and/or the like) layer on the substrate 100. CMP or another suitable method may be employed to remove portions of the HDP oxide layer such that the top surface of the HDP oxide layer may be approximately planar with the top surface of the pad nitride layer 106. In this manner, oxide regions 800 may be formed.

Figure 9:
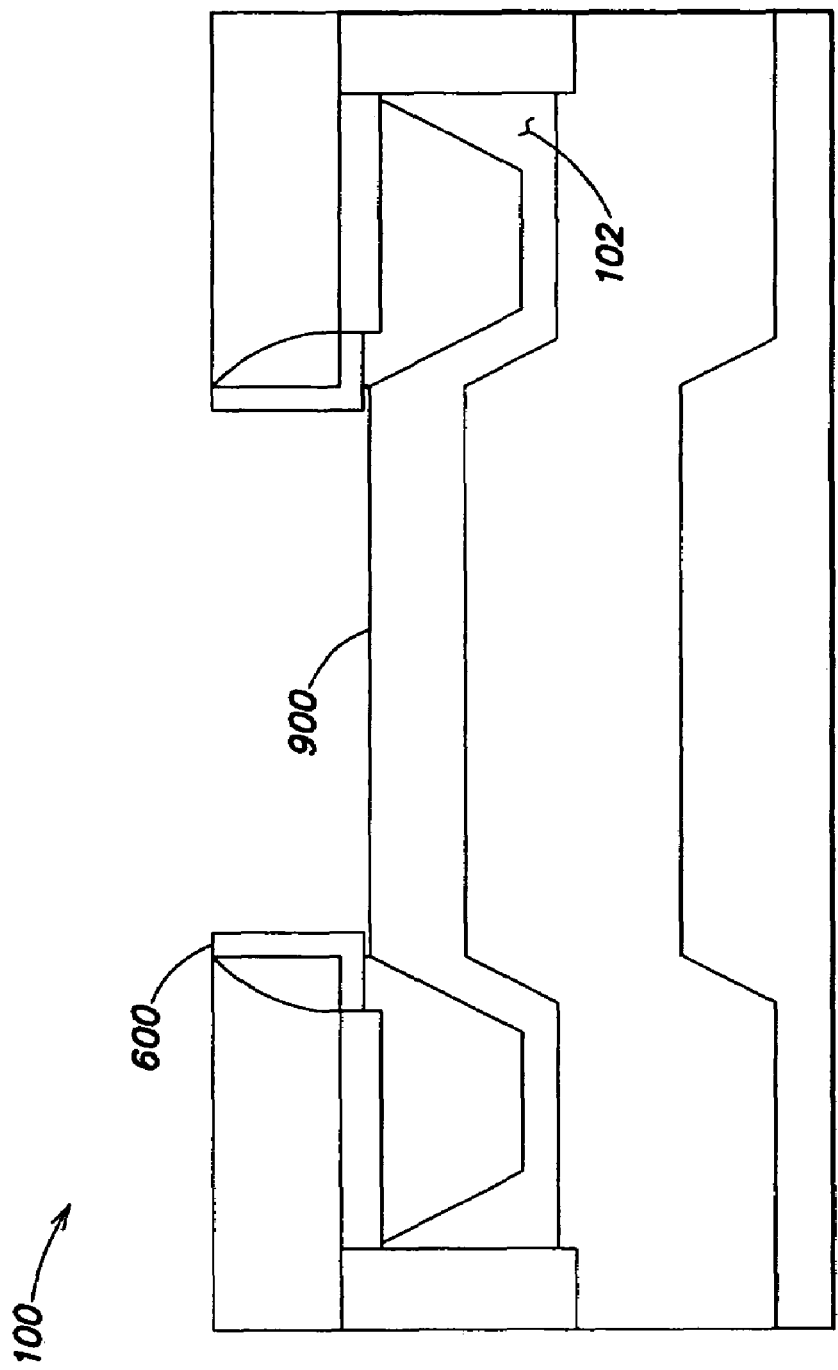
FIG. 9 illustrates a cross-sectional side view of the substrate following a step of the first exemplary method of forming an improved PFET in which portions of the pad nitride and/or pad oxide layers may be removed to form a vacant gate region in accordance with an embodiment of the present invention.

FIG. 9 illustrates a cross-sectional side view of the substrate 100 following a step of the first exemplary method of forming an improved PFET in which portions of the pad nitride and/or pad oxide layers may be removed to form a vacant gate region in accordance with an embodiment of the present invention. With reference to FIG. 9, a selective nitride etch process (e.g., RIE selective to oxide) may be employed to first remove portions of the pad nitride layer layer 106. Then the RIE etch chemistry is switched to selectively remove the pad oxide layer 104 (e.g. selective to nitride) in the gate region. The pad oxide etch may also remove an insignificant amount of HDP oxide regions 800. Consequently, a portion 900 of a top surface of the silicon layer 102 and/or a surface of the oxide liner 600 may be exposed.

Figure 10:
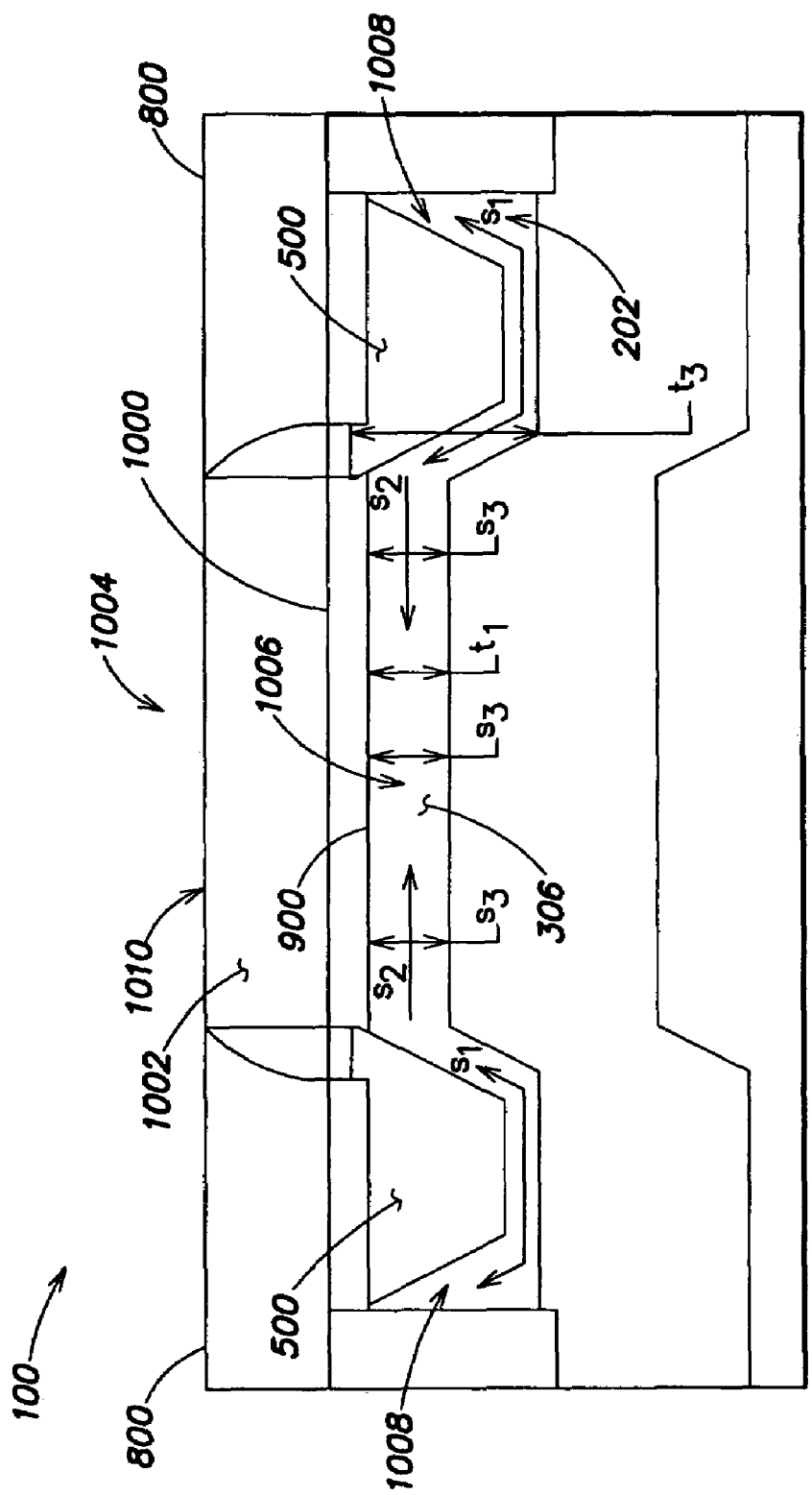
FIG. 10 illustrates a cross-sectional side view of the substrate following a step of the first exemplary method of forming an improved PFET in which a gate dielectric layer and a gate conductor layer are formed in accordance with an embodiment of the present invention.

FIG. 10 illustrates a cross-sectional side view of the substrate 100 following a step of the first exemplary method of forming an improved PFET in which a gate dielectric layer and a gate conductor layer are formed in accordance with an embodiment of the present invention. With reference to FIG.

10, a gate dielectric (e.g., oxide, oxynitride, a high-k material and/or the like) layer 1000 is formed on a portion 900 of the exposed surface of the silicon layer 202. The gate dielectric layer 1000 may be employed as the PFET gate insulator. Well known suitable processes, including thermal oxidation, nitridation, CVD, PVD deposition and/or the like may be employed to form gate dielectric layer 1000. Further, a deposition process (e.g., CVD and/or the like) may be employed to form a gate conductor (e.g., polysilicon, silicide, metal and/or the like) layer 1002 on the dielectric layer 1000. CMP or another suitable method may be employed to remove portions of the gate conductor layer 1002 such that a top surface of the gate conductor 1002 may be approximately planar with a top surface of the oxide regions 800. In some embodiments, the gate conductor layer 1002 may be employed as the gate conductor of the manufactured PFET. Thereafter, back end of line (BEOL) processing may be employed to form the PFET 1004. In this manner, one or more vias and corresponding studs may be formed. Further, interlevel dielectrics and/or wiring of the substrate 100 may be formed.

Through use of the exemplary method described above with reference to FIGS. 1-10, an improved PFET 1004 may be formed on the substrate 100. More specifically, a PFET 1004 having a gate channel region 1006 of a first thickness t1 and at least one composite source/drain diffusion region 1008 having a second thickness t3 greater than the first thickness t1 is formed. The at least one composite source/drain diffusion region 1008 is adapted to cause a stress and/or strain in the gate channel region 1006. Further, significantly all (e.g., about 80% to about 100%) of the at least one composite source/drain diffusion region 1008 is below a bottom surface of a gate 1010. More specifically, significantly all of the at least one composite source/drain diffusion region 1008 is below the gate conductor layer 1002 of the PFET 1004 (although a larger or smaller and/or different percentage range of the composite source/drain diffusion region 1008 may be below the gate). The composite source/drain diffusion region 1008 may include a SiGe region (e.g., an embedded SiGe (eSiGe) region) 500.

The PFET 1004 may provide improved performance. More specifically, the SiGe 500 region in the composite source/drain diffusion region 1008 may cause a uniaxial tensile stress S1 in the thin silicon region underlying embedded SiGe region 500. Uniaxial tensile stress S1 is transferred to the gate channel region 1006 as uniaxial compressive stress S2 and vertical tensile stress S3. Stresses transferred to the gate channel region 1006 result in elastic deformation (strain) of the silicon lattice spacing. Such stresses are indicated by arrows S1, S2 and S3. Uniaxial compressive strain and vertical tensile strain in the gate channel region 1006 may enhance hole mobility, significantly improving the performance of the PFET.

A conventional PFET may have a composite SOI layer of a uniform thickness. Therefore, composite source/drain regions have the same thickness as a gate channel region of such PFETS. As thicknesses of SOI layers in such conventional PFETs continue to shrink, a thickness of silicon beneath a SiGe region in a source/drain region may not be decreased below approximately 20 nm. Therefore, a volume of the SiGe region above the silicon in the composite source/drain region must be decreased. Consequently, stress and/or strain in the silicon underlying the SiGe is reduced. Further, a cross-sectional area that transfers stress and/or strain from the source/drain region to a gate channel of the conventional PFET may be reduced. Therefore, such conventional PFETs have difficulty creating a desired level of stress and/or strain in the gate channel.

The PFET 1004 may avoid disadvantages of the conventional PFET described above. In contrast to the conventional PFET, the PFET 1004 may include composite source-drain regions 1008 whose respective thicknesses t3 are greater than a thickness of SOI in a body of the PFET (e.g., a gate channel region thickness t1). The composite source/drain regions 1008 which are relatively thicker than the gate channel region 1006 enable thicker SiGe regions 500 to be formed (than in conventional PFETs). Therefore, increased stress and/or strain may be transferred to the underlying portions of the silicon layer 202 in the composite source/drain regions 1008. Consequently, an increased stress and/or strain may be caused in the gate channel region 1006 of the PFET 1004. Further, the thicker SiGe regions 500 may reduce a need to thin the silicon layer 202, which may lead to a tighter tolerance of PFET transconductance.

Further, the present invention avoids disadvantages of conventional PFETs employing a raised source/drain (RSD) region. More specifically, the present invention avoids the considerable gate to diffusion capacitance of such conventional PFETs due to the proximity of the RSD region to a gate sidewall of the PFET, which detracts from performance. In contrast to such conventional PFETS, the present invention may thicken a source/drain region by adding semiconductor material below a level of a back interface of the body instead of above the original surface.

Figure 11:
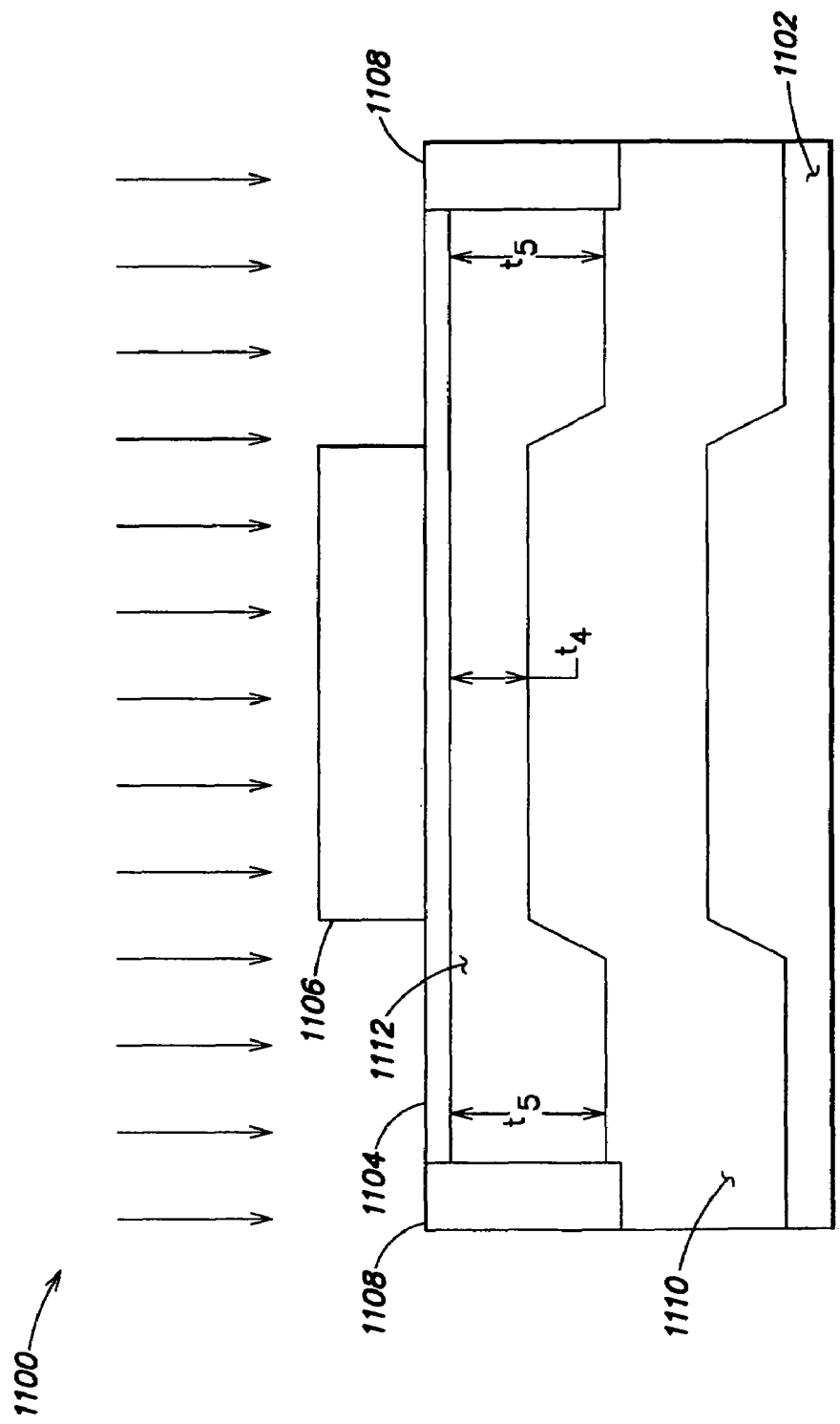
FIG. 11 illustrates a cross-sectional side view of a substrate 1100 following a step of a second exemplary method of forming an improved PFET in which boron is implanted into bulk silicon in accordance with an embodiment of the present invention.

FIG. 11 illustrates a cross-sectional side view of a substrate 1100 following a step of a second exemplary method of forming an improved PFET in which boron is implanted into bulk silicon in accordance with an embodiment of the present invention. With reference to FIG. 11, a substrate 1100 may be provided. The substrate 1100 may include bulk silicon 1102, a pad oxide layer 1104, a pad nitride layer 1106, and shallow isolation trenches 1108. The substrate 1100 may be formed by methods similar to those described with reference to FIG. 1.

The substrate 1100 may be exposed to high-dose boron implantation or another suitable process so as to form a boron-implanted layer 1110 in the bulk silicon 1102. Such layer 1110 may be highly doped with p+ dopant. Consequently, a silicon layer 1112 may be formed between the boron implanted layer 1110 and the pad oxide layer 1104. The boron implantation may employ an energy range of about 25 keV to about 200 kev to a peak concentration of boron of about $5 \times 10^{17}$ cm$^{-3}$ to about $1 \times 10^{20}$ cm$^{-3}$ into the substrate 1100 (although a larger or smaller and/or different energy and/or peak concentration range may be employed). Additionally or alternatively, a different type of boron, such as BF$_2$ may be implanted into the substrate 1100.

The pad nitride layer 1106 may affect a depth at which the boron is implanted into the substrate 1100 thereunder. For example, boron which passes through the pad nitride layer 1106 may be implanted into the substrate 1100 shallower than remaining boron. Consequently, a thickness of the silicon layer 1112 may be less in the region under the pad nitride layer 1106 than other regions. For example, the region of the silicon layer 1112 disposed beneath the nitride layer 1106 may have a thickness t4 of about 10 nm to about 50 nm. The region of the silicon layer 1112 not under the nitride layer 1106 may have a thickness t5 of about 50 nm to about 300 nm. However, a larger or smaller and/or different thickness range may be employed for the silicon layer 1112 beneath the nitride layer 1106 and/or for the silicon layer 1112 elsewhere (e.g., not beneath the nitride layer 1106).

Figure 12:
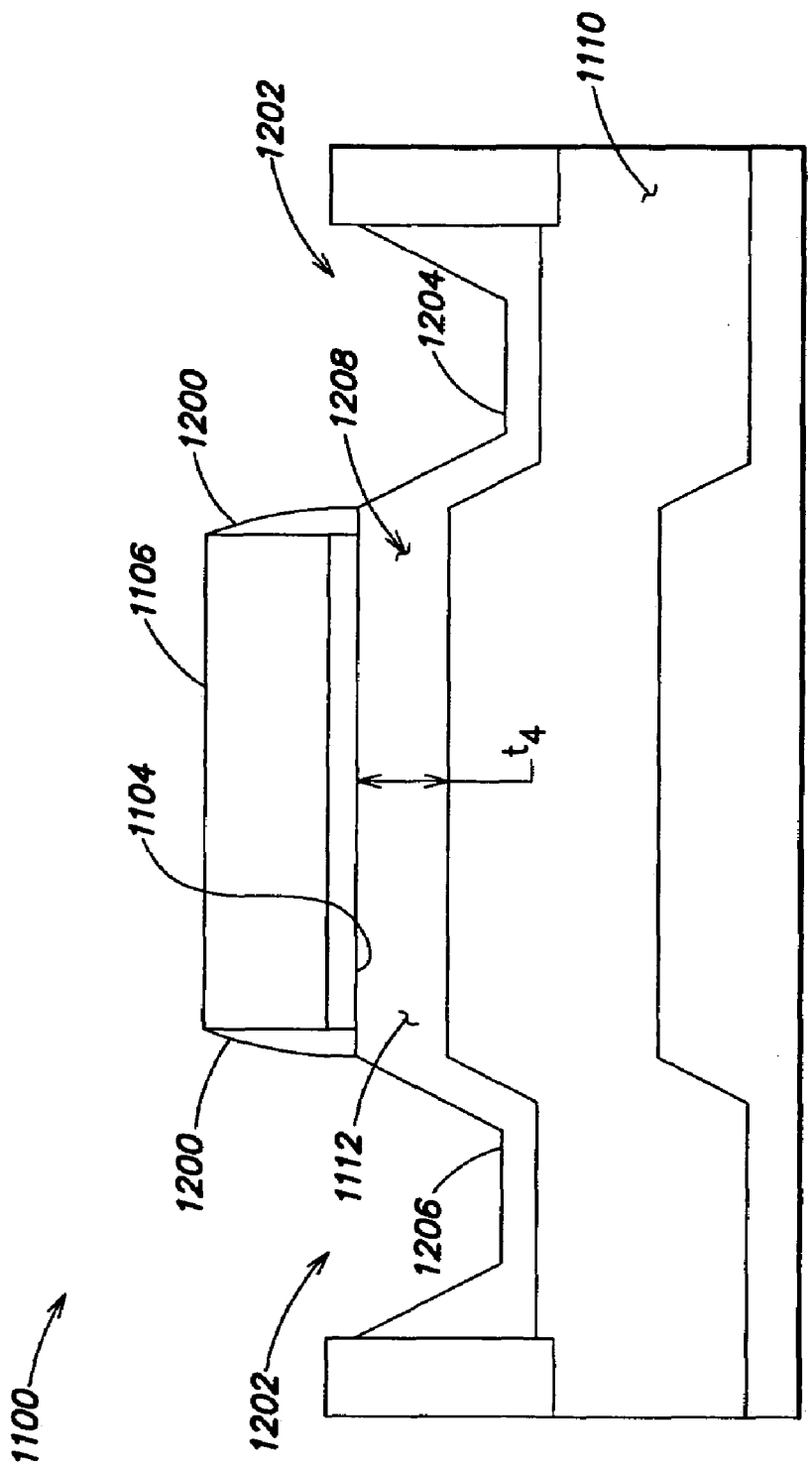
FIG. 12 illustrates a cross-sectional side view of the substrate following a step of the second exemplary method of forming an improved PFET in which exposed portions of the pad oxide layer are removed and portions of the silicon layer are recessed in accordance with an embodiment of the present invention.

FIG. 12 illustrates a cross-sectional side view of the substrate 1100 following a step of the second exemplary method of forming an improved PFET in which exposed portions of the pad oxide layer are removed and portions of the silicon layer are recessed in accordance with an embodiment of the present invention. With reference to FIG. 12, CVD or another suitable process followed by RIE or another suitable process may be employed to form silicon nitride spacers 1200 on at least one surface (e.g., sidewalls) of the pad nitride layer 1106. Although silicon nitride spacers 1200 are described above, the spacers 1200 may comprise one or more different materials. The silicon nitride spacers 1200 may serve to protect the sidewalls of the pad nitride layer 1106 during processing. RIE selective to nitride and silicon or another suitable method may be employed to remove exposed portions of the pad oxide layer 1104. Further, one or more portions of the silicon layer 1112, which may be or a low concentration, may be removed (e.g., using taper RIE and/or another suitable method) so as to form recesses 1202. The recesses 1202 may be formed such that sidewalls of the recesses 1202 may have slopes so as to provide a tapered profile to the recesses 1202.

The taper RIE may allow a controlled thickness of the silicon layer 1112 remaining above the boron-implanted layer 1110. For example, the thickness of the silicon layer 1112 may range from about 20 nm to about 60 nm. Alternatively, a selective RIE (e.g., selective to heavily-doped p-type Si) or another suitable method may be employed to remove portions of the silicon layer 1112 such that the boron-implanted layer 1110 may serve to control (e.g., by slowing the etch rate of the selective RIE process) the recess depth, and therefore, the thickness of the silicon layer 1112. Portions of the silicon layer 1112 in respective bottoms 1204 and 1206 of the recesses 1202 may serve as a seed layer for subsequent epitaxy and/or another suitable process. In this manner, regions of the SiGe or another suitable material subsequently may be grown in the recesses 1202. Such regions may serve as source/drain regions of the PFET being manufactured. Portions of the silicon layer 1112 beneath the nitride layer 1106 may serve as a channel 1208 of the PFET being manufactured.

Figure 13:
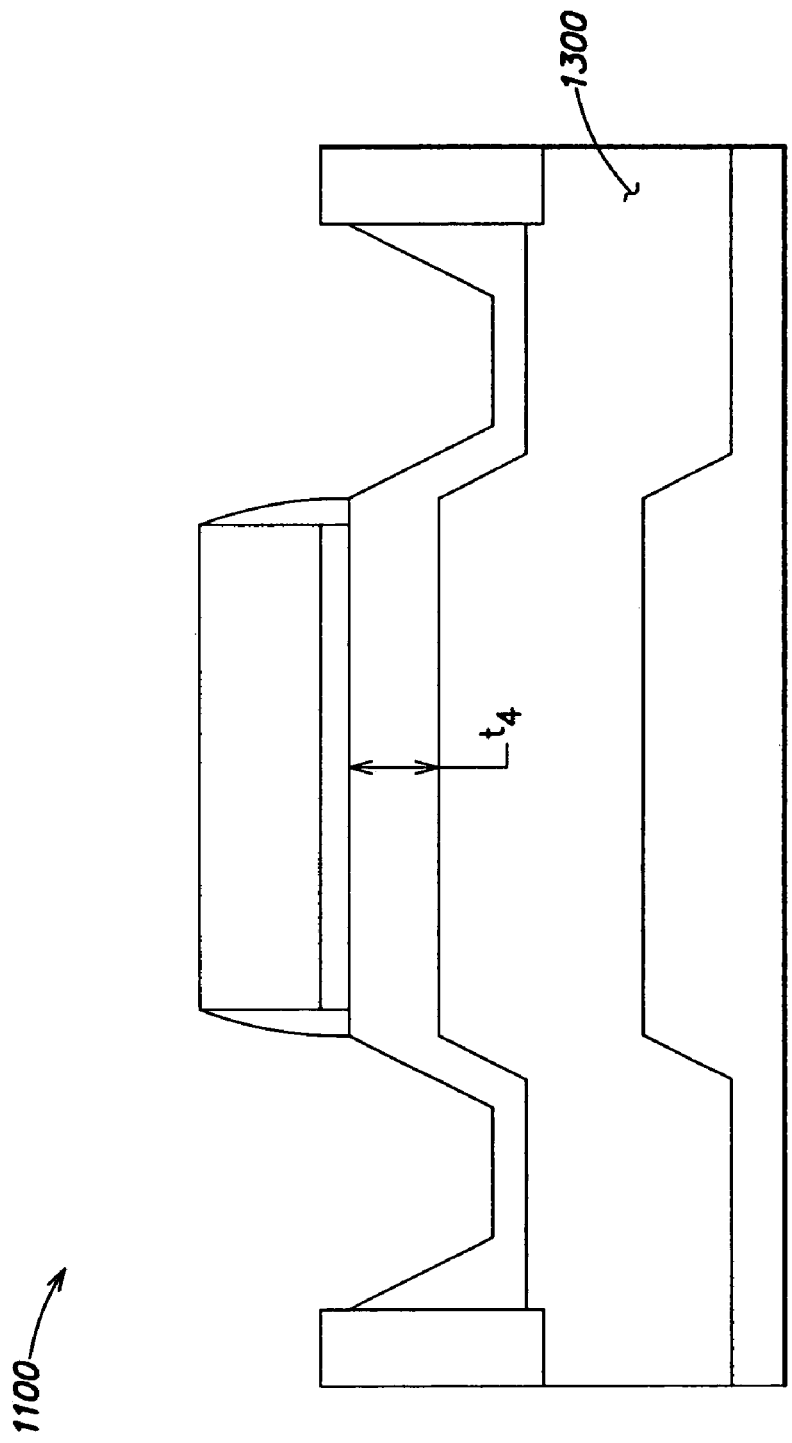
FIG. 13 illustrates a cross-sectional side view of the substrate following a step of the second exemplary method of forming an improved PFET in which a boron-implanted layer is chemically converted into a porous silicon layer in accordance with an embodiment of the present invention.

FIG. 13 illustrates a cross-sectional side view of the substrate 1100 following a step of the second exemplary method of forming an improved PFET in which the boron-implanted layer is chemically converted into a porous silicon layer in accordance with an embodiment of the present invention. With reference to FIG. 13, the substrate 1100 may undergo anodization. For example, current may be applied to the substrate 1100 while the substrate 1100 is immersed in a hydrofluoric (HF) solution and/or the like. In this manner, the boron-implanted layer 1110 may be converted (e.g., chemically) into a porous silicon layer 1300. Process variables may be adjusted so as to change the porosity of the porous silicon layer 1300. For example, a concentration of the hydrofluoric solution and/or current employed during anodization may be adjusted to change the porosity of the porous layer 1300. Further, variables of the boron implantation may be adjusted to change a density of boron in the boron-implanted layer 1110, thereby adjusting the porosity of the porous silicon layer 1300.

The substrate 1100 may undergo annealing, such as a hydrogen (e.g., $H_2$) bake, to remove a substantial portion (e.g., a significant fraction) of the boron from the substrate 1100. Annealing may be performed at a temperature of about 800° C. to about 1100° C. and for about 10 seconds to about 2 hours (although a larger or smaller and/or different temperature range and/or time period may be employed). Such annealing may reduce a concentration of boron outdiffusing into the layers above the porous silicon layer 1300 such that the outdiffusing may not affect the PFET electrical performance.

Figure 14:
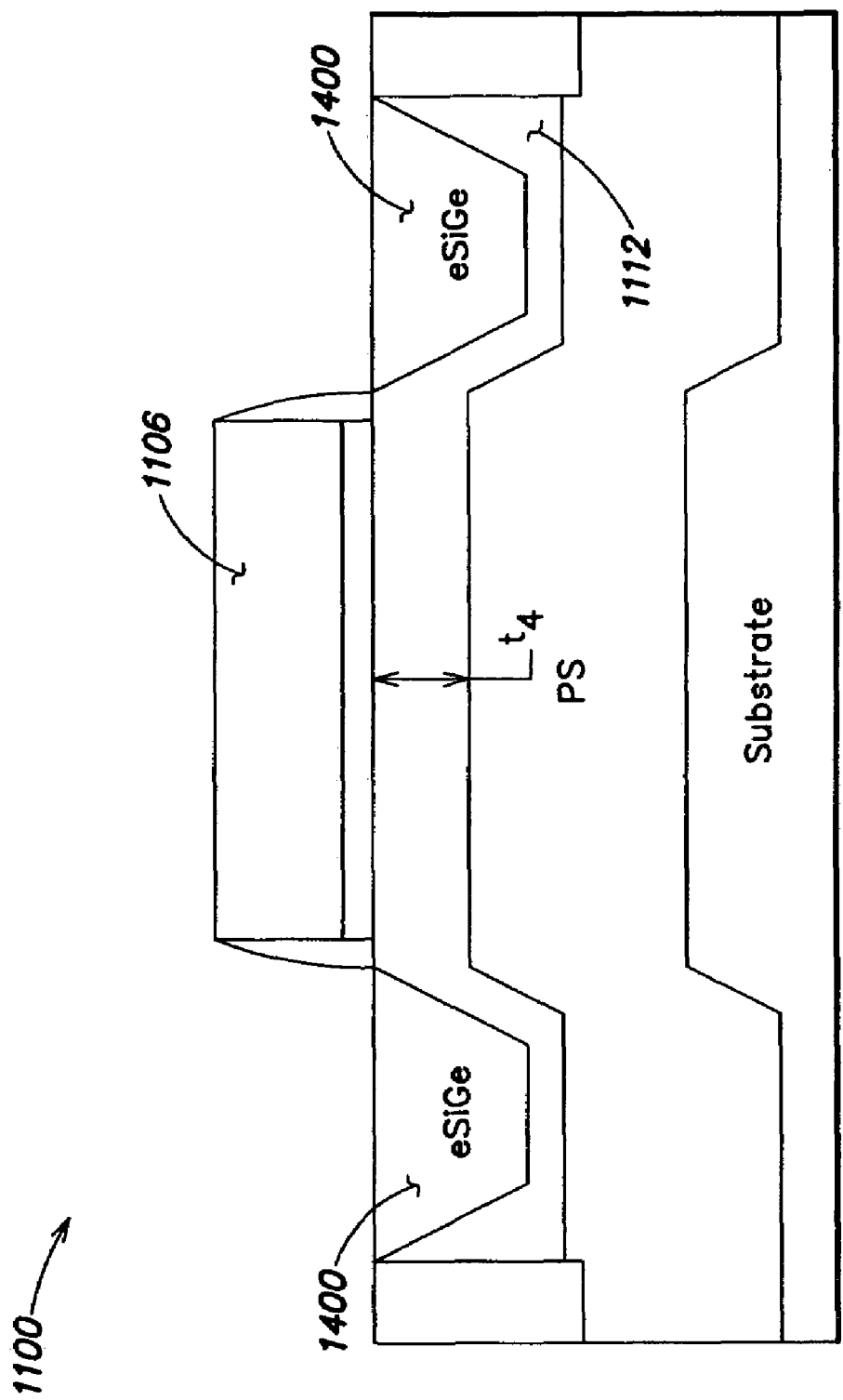
FIG. 14 illustrates a cross-sectional side view of the substrate following a step of the second exemplary method of forming an improved PFET in which SiGe regions are formed in the source/drain regions of the PFET in accordance with an embodiment of the present invention.

FIG. 14 illustrates a cross-sectional side view of the substrate 1100 following a step of the second exemplary method of forming an improved PFET in which SiGe regions are formed in the source/drain region of the PFET in accordance with an embodiment of the present invention. With reference to FIG. 14, epitaxy may be employed to form SiGe regions 1400 in the recesses 1202. During epitaxy a lattice structure (e.g., inter-atomic spacing, geometrical arrangements and/or the like) of SiGe on a top surface of the silicon layer 1112 may attempt to match a lattice structure of silicon in the silicon layer 1112. Such matching of a lattice structure at a bottom surface of the SiGe regions 1400 and the top surface of the silicon layer 1112 may induce lattice strain (e.g., elastic atomic displacement and/or the like) in portions of the SiGe regions 1400 and/or silicon layer 1112. During epitaxy, the SiGe regions 1400 may be grown by adding silicon and/or germanium atoms to the existing lattice structure of the SiGe regions 1400. Epitaxy may continue until a top surface of the SiGe region 1400 is higher than the pad nitride layer 1106, thereby achieving overgrowth. Thereafter, CMP or other suitable method may be employed to planarize the top surface of each SiGe region 1400 with a top surface of the pad nitride layer 1106. A selective recess process (e.g., RIE and/or the like) may remove portions of the SiGe regions 1400 such that respective top surfaces of the SiGe regions 1400 are approximately planar with a top surface of the silicon layer 1112. The SiGe regions 1400 along with portions of the silicon layer 1112 thereunder may form a portion of a composite semiconductor source/drain regions of the PFET.

Figure 15:
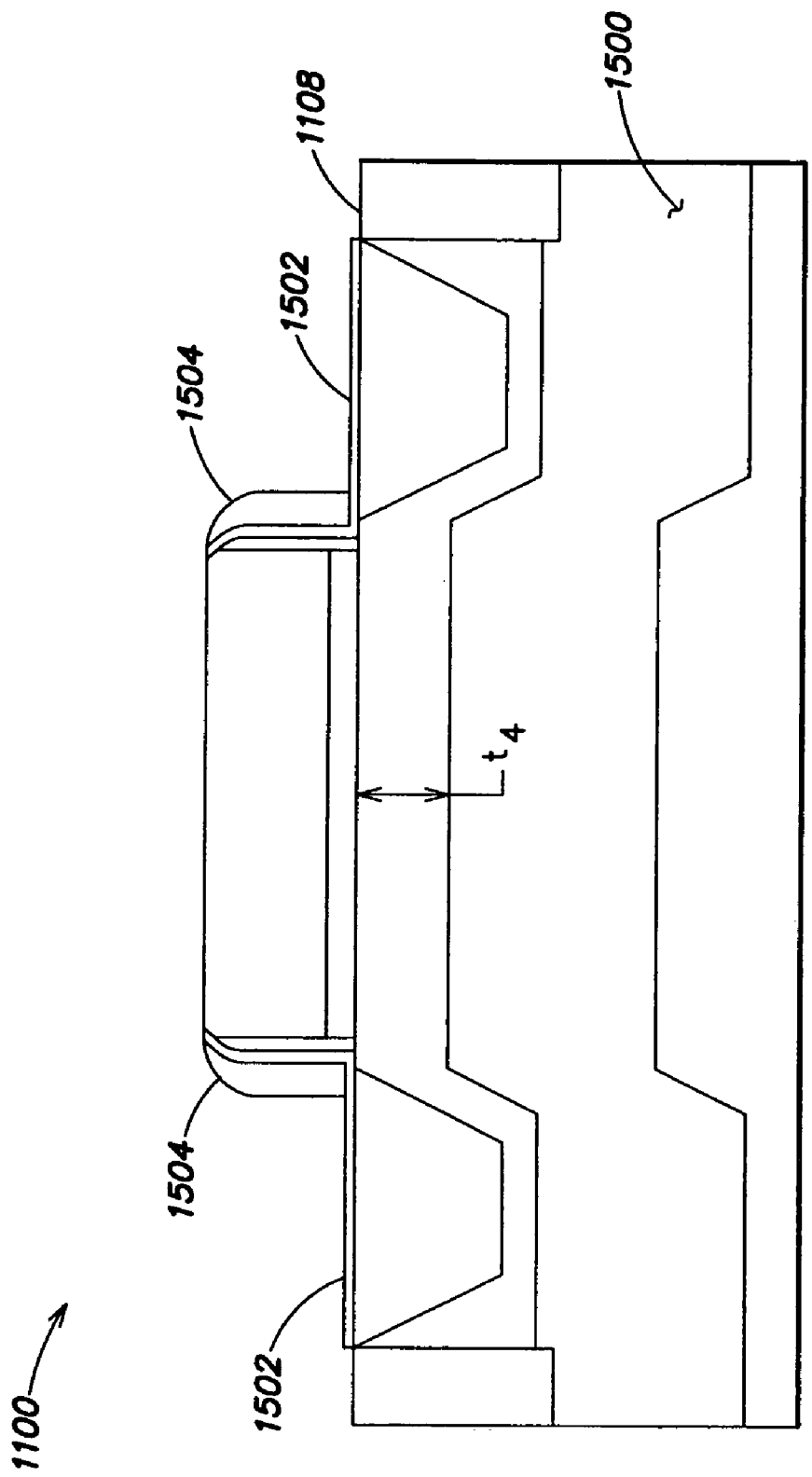
FIG. 15 illustrates a cross-sectional side view of the substrate following a step of the second exemplary method of forming an improved PFET in which the porous silicon is converted into a buried oxide layer, an oxide liner and nitride spacers are formed on the substrate in accordance with an embodiment of the present invention.

FIG. 15 illustrates a cross-sectional side view of the substrate 1100 following a step of the second exemplary method of forming an improved PFET in which the porous silicon is converted into a buried oxide layer, an oxide liner and nitride spacers are formed on the substrate 1100 in accordance with an embodiment of the present invention. With reference to FIG. 15, a thermal oxidation process (e.g., wet or dry, at atmospheric or high-pressure and/or the like) may be employed to convert (e.g., chemically) the porous silicon layer 1300 into a BOX (e.g., silicon dioxide) layer 1500. The thermal oxidation process may be performed for a short period of time (e.g., about 30 seconds to 30 minutes) because oxidation is very rapid due to the possible rapid diffusion of an oxidizing species (e.g., oxygen and/or the like) through the shallow isolation trenches 1108 and the porous silicon layer 1300. A relatively thin layer of oxide may form on a crystalline semiconductor surface. Such oxide may later be removed.

Thermal oxidation may be performed in a dry and/or wet oxygen ambient at a temperature that may range from about 750° C. to about 1100° C. However, different process parameters may be employed. For example, a larger or smaller and/or different temperature range may be employed.

A deposition process (e.g., CVD and/or the like) followed by RIE or another suitable method may be employed to form an oxide (e.g., silicon dioxide and/or the like) liner 1502 on portions of the top surface of the substrate 1100. The oxide liner 1502 may be about 2 nm to about 20 nm thick (although a larger or smaller and/or different thickness range may be employed). A deposition process (e.g., conformal CVD and/or the like) followed by RIE or another suitable method may be employed to form nitride spacers 1504 on at least one surface (e.g., an approximately vertical surface) of the oxide liner 1502.

Figure 16:
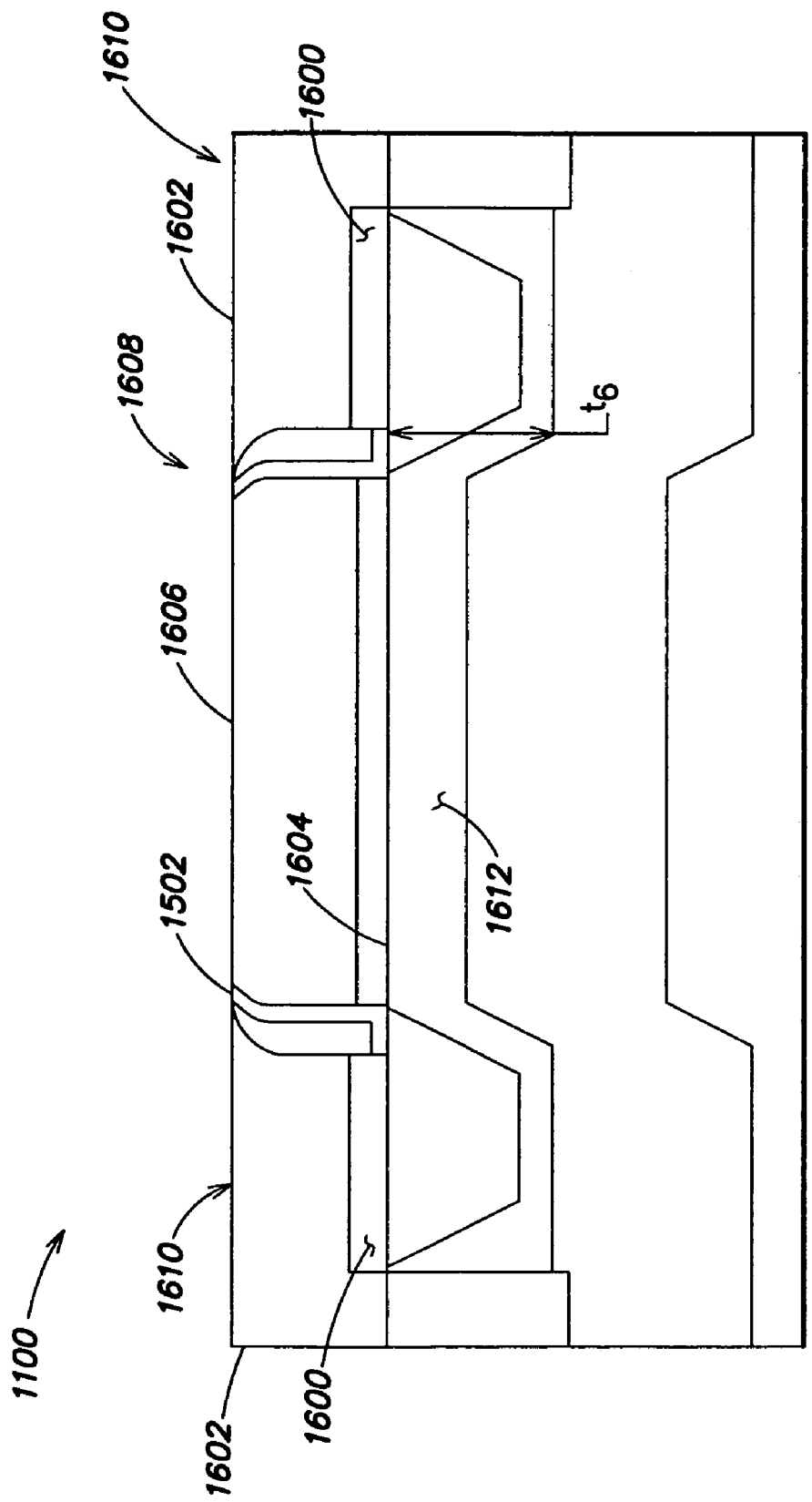
FIG. 16 illustrates a cross-sectional side view of the substrate following a step of the second exemplary method of forming an improved PFET in which the pad nitride layer, pad oxide layer and portions of the oxide liner may be removed, and silicide and oxide regions may be formed in accordance with an embodiment of the present invention.

FIG. 16 illustrates a cross-sectional side view of the substrate 1100 following a step of the second exemplary method of forming an improved PFET in which the pad nitride layer, portions of the oxide liner and/or pad oxide layer may be removed, and silicide regions and oxide regions may be formed in accordance with an embodiment of the present invention. With reference to FIG. 16, methods similar to those discussed with reference to FIGS. 7-10 may be employed to remove the pad nitride layer 1106, portions of the oxide liner 1502, and pad oxide layer 1104 may be removed. Further, methods similar to those discussed with reference to FIGS. 7-10 may be employed to form a silicide region 1600, oxide regions 1602, gate dielectric 1604 and a gate conductor layer 1606. Thereafter, back end of line (BEOL) processing may be employed to form the PFET 1608. In this manner, one or more vias and corresponding studs may be formed. Further, inter-level dielectrics and/or wiring of the substrate 1100 may be formed. In this manner, a composite source/drain diffusion region 1610 having a thickness t6 of about 50 nm to about 300 nm may be formed (although a larger or smaller and/or different thickness range may be employed). Further, a portion of the silicon layer 1112 beneath the gate dielectric and gate conductor layers 1604-1606 may serve as a gate channel region 1612.

Figure 17:
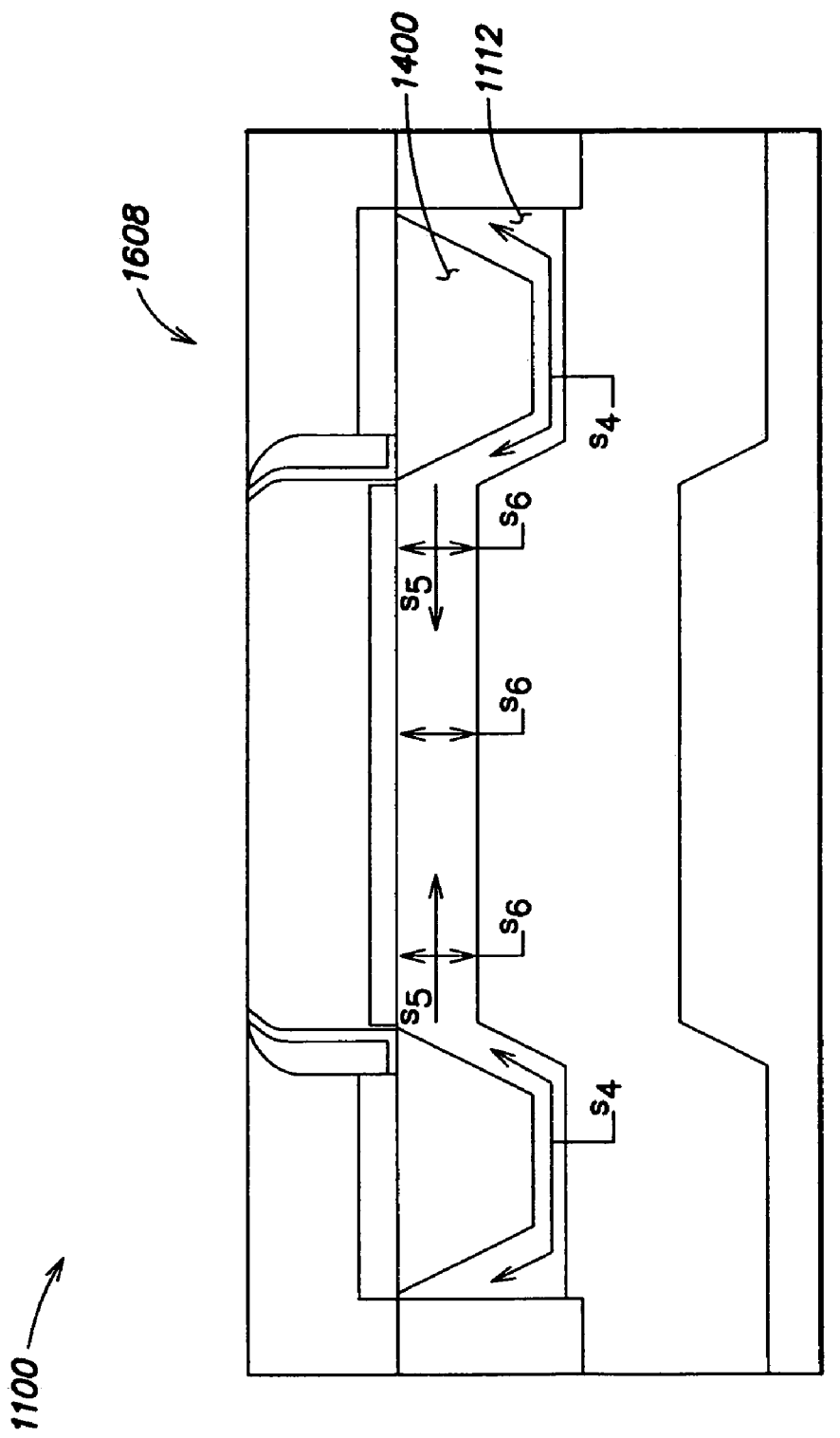
FIG. 17 is a cross-sectional side view of the substrate including an improved PFET manufactured using the second exemplary method in which the stresses and stains are depicted in accordance with an embodiment of the present invention.

FIG. 17 is a cross-sectional side view of the substrate 1100 including an improved PFET manufactured using the second exemplary method in which the stresses and stains are depicted in accordance with an embodiment of the present invention. With reference to FIG. 17, as discussed above with reference to FIG. 14, the lattice mismatch of the SiGe regions 1400 and the top surface of the silicon layer 1112 may induce a stress and/or strain S4 in a portion of the silicon layer 1112 in the composite source/drain diffusion region 1610. Such stress and/or strain S4 may cause a compressive (e.g., axial compressive) stress and/or strain S5 and a tensile (e.g., vertical tensile) stress and/or strain S6 in a portion of the silicon layer 1112 in the gate channel region 1612, thereby improving performance of the PFET 1608.

Through use of the exemplary method described above with reference to FIGS. 11-17, an improved PFET 1608 may be formed on the substrate 1100. More specifically, a PFET 1608 having advantages over conventional PFETs similar to those of the PFET 1004 discussed with reference to FIGS. 1-10 may be formed.

The foregoing description discloses only exemplary embodiments of the invention. Modifications of the above disclosed apparatus and method which fall within the scope of the invention will be readily apparent to those of ordinary skill in the art. For instance, in some embodiments, one or more NFETs may be manufactured along with the improved PFET 1004, 1608. In such embodiments, source/drain diffusion regions of NFETs being manufactured may be masked during recess etching of the PFET source/drain diffusion regions. Thus, the NFETs being manufactured may not be subjected to stress from SiGe epitaxy. Such stress would be detrimental to NFET performance. However, the NFETs may benefit from thicker composite source/drain diffusion regions 1008, 1608 of the PFET 1004, 1608 which provide a reduced series resistance. Desired NFET stress and/or strain (e.g., axially tensile) may be obtained using an overlying tensile nitride liner which may enhance electron mobility in the channel. Further, a thickness of a portion of the silicon layer 1112 in the composite source/drain diffusion region 1008, 1608 may be no greater than approximately half a thickness of the SiGe region 500, 1400 (although a larger or smaller thickness may be employed for the silicon layer 1112).

Accordingly, while the present invention has been disclosed in connection with exemplary embodiments thereof, it should be understood that other embodiments may fall within the spirit and scope of the invention, as defined by the following claims.

The invention claimed is:

1. A method of manufacturing a PFET on a substrate, comprising:
   forming a gate channel region of the PFET having a first thickness on the substrate; and
   forming at least one composite source/drain diffusion region of the PFET having a second thickness greater than the first thickness on the substrate;
   wherein the at least one composite source/drain diffusion region causes a strain in the gate channel region;
   wherein significantly all of the at least one composite source/drain diffusion region is below a bottom surface of a gate of the PFET;
   wherein forming the gate channel region having the first thickness and forming at least one composite source/drain diffusion region having the second thickness greater than the first thickness includes forming a silicon-on-insulator (SOI) layer on the substrate; and
   a portion of the SOI layer in the at least one composite source/drain diffusion region is deeper than the SOI layer in the gate channel region.

2. The method of claim 1 further comprising forming a silicon germanium (SiGe) region above the portion of the SOI layer in the composite source/drain diffusion region.

3. The method of claim 2 wherein forming the silicon germanium (SiGe) region above the portion of the SOI layer in the composite source/drain diffusion region includes epitaxially growing the SiGe region above the portion of the SOI layer in the composite source/drain diffusion region.

4. The method of claim 1 wherein forming the SOI layer includes:
   implanting oxygen into the substrate; and
   annealing the substrate.

5. The method of claim 1 wherein forming the SOI layer includes:
   implanting boron into the substrate;
   anodizing the substrate; and
   annealing the substrate.

6. The method of claim 1 wherein about 80% of the at least one composite source/drain diffusion region is below the bottom surface of a gate of the PFET.

7. A PFET formed on a substrate, comprising:
   a gate channel region having a first thickness formed on the substrate;
   at least one composite source/drain diffusion region having a second thickness greater than the first thickness formed on the substrate; and
   a silicon-on-insulator (SOI) layer in the gate channel region and at least one composite source/drain diffusion region;
   wherein the at least one composite source/drain diffusion region causes a strain in the gate channel region;
   wherein significantly all of the at least one composite source/drain diffusion region is below a bottom surface of a gate of the PFET; and
   wherein a portion of the SOI layer in the at least one composite source/drain diffusion region is deeper than the SOI layer in the gate channel region.

8. The PFET of claim 7 further comprising a silicon germanium (SiGe) region above the portion of the SOI layer in the composite source/drain diffusion region.

9. The PFET of claim 8 wherein the SiGe region causes a strain in the portion of the SOI layer in the at least one composite source/drain diffusion region.

10. The PFET of claim 9 wherein the SOI layer causes a strain in the portion of the SOI layer in the gate channel region based on the strain in the portion of the SOI layer in the composite source/drain diffusion region.

11. The PFET of claim 8 wherein the SiGe region includes epitaxially-grown SiGe.

12. The PFET of claim 7 wherein the first thickness is about 10 nm and the second thickness is about 50 nm.

13. A substrate, comprising: a PFET having:
a gate channel region having a first thickness formed on the substrate;
at least one composite source/drain diffusion region having a second thickness greater than the first thickness formed on the substrate; and
a silicon-on-insulator (SOI) layer in the gate channel region and at least one composite source/drain diffusion region;
wherein the at least one composite source/drain diffusion region causes a strain in the gate channel region;
wherein significantly all of the at least one composite source/drain diffusion region is below a bottom surface of a gate of the PFET;
wherein a portion of the SOI layer in the at least one composite source/drain diffusion region is deeper than the SOI layer in the gate channel region.

14. The substrate of claim 13 wherein the PFET further comprises a silicon germanium (SiGe) region above the portion of the SOI layer in the composite source/drain diffusion region.

15. The substrate of claim 14 wherein the SiGe region causes a strain in the portion of the SOI layer in the at least one composite source/drain diffusion region.

16. The substrate of claim 15 wherein the SOI layer causes a strain in the portion of the SOI layer in the gate channel region based on the strain in the portion of the SOI layer in the composite source/drain diffusion region.

17. The substrate of claim 13 wherein the first thickness is about 10 nm and the second thickness is about 50 nm.

* * * * *